United States Patent [19]

Waldorf et al.

[11] 4,112,393
[45] Sep. 5, 1978

[54] AUTOMATICALLY STABILIZED OSCILLATOR

[75] Inventors: Lindsey E. Waldorf; Kenneth E. Monroe, both of Ann Arbor, Mich.

[73] Assignee: Patents Licensing International, Ltd., Southfield, Mich.

[21] Appl. No.: 790,436

[22] Filed: Apr. 25, 1977

Related U.S. Application Data

[63] Continuation-in-part of Ser. No. 560,396, Mar. 20, 1975, Pat. No. 4,020,310.

[51] Int. Cl.[2] .............................................. H03B 3/02
[52] U.S. Cl. .............................. 331/109; 219/10.55 R; 331/117 R
[58] Field of Search .................... 331/117, 109, 183; 219/10.55 R

[56] References Cited

U.S. PATENT DOCUMENTS

| | | | |
|---|---|---|---|
| 3,064,177 | 11/1962 | Bender | 331/109 |
| 3,218,574 | 11/1965 | Racy et al. | 331/109 |
| 3,292,104 | 12/1966 | Kitchin | 331/183 |
| 3,775,702 | 11/1973 | Wallace | 331/117 R |

*Primary Examiner*—John Kominski
*Attorney, Agent, or Firm*—Krass & Young

[57] ABSTRACT

An induction heating generator consists of a Hartley oscillator employing a tank circuit, including the induction heating coil, disposed in series with the emitter-collector circuit of the transistor. A bias circuit consisting of the parallel combination of a capacitor and diode is connected to the base and the feed-back voltage to the base is generated by a tickler coil. In the absence of oscillations the base is biased for class A operation and the resulting feed-back current charges the bias circuit to shift the operating point to class C operation. The bias voltage is decreased when the tank coil is loaded, lowering its impedance. This maintains stable operation of the oscillator independent of variations in the load. When the coupling between the load and the inductor is so great as to overload the oscillator, the bias circuit prevents oscillation.

7 Claims, 2 Drawing Figures

AUTOMATICALLY STABILIZED OSCILLATOR

REFERENCE TO RELATED APPLICATIONS

This application is a continuation-in-part of U.S. Ser. No. 560,396, filed Mar. 20, 1975, now U.S. Pat. No. 4,020,310.

BACKGROUND OF THE INVENTION

1. Field of the Invention

This invention relates to transistor oscillator circuits and more particularly to a self-optimizing Hartley oscillator circuit for use with induction heating systems.

2. Prior Art

High frequency induction heating generators conventionally take the form of vacuum tube or semi-conductor oscillators having the primary of the induction heating output transformer forming part or all of the inductance in the oscillator tank circuit. These circuits must include means for stabilizing the oscillator against changes in the inductance of the tank circuit resulting from changes in the coupling of the load to the inductance or from variations in impedance of the load which result in reflected variations in impedance of the tank circuit. A number of techniques have been developed in the prior art to stabilize the oscillator with respect to these changes. Broadly, these techniques have either been to design the tank circuit and the induction heating coil so that the change in load does not appreciably affect either the frequency of oscillation or the Q of the tank circuit or to provide auxilliary impedance elements which would be switched into the tank circuit as the load changes to maintain the oscillator operating conditions at an optimum.

Efforts to minimize the effects of load change on the tank circuit have typically involved forming the tank inductance of a relatively small coil section which acts as the induction heating transformer primary and a substantially larger inductance section which does not have its field coupled to the load. The variations in impedance which occur when the small primary winding section of the tank coil is coupled to the load thus represent a small percentage of the total coil impedance and do not substantially deteriorate the Q of the amplifier or shift its operating frequency. In designing these circuits the portion of the induction coil which acts as the induction heating primary must be selected to strike a balance between the losses in efficiency which are sustained because the large induction heating currents must pass through the non-coupled section of the tank inductance and the loss in stability in face of a varying load, which increases in effect as the proportion of the coil dedicated to inducing currents in the load is increased. As a result, these circuits can often be characterized as having both efficiency and stability which is substantially less than the optimum. The circuits which switch auxilliary impedance elements in the tank circuit to compensate for the impedance variation caused by loading must involve relatively simple, manually actuated switching circuits that depend for their accuracy on a priori calculations as to the effect of the load on the inductance or relatively complicated and expensive self-balancing circuits.

Considering a separate technology that may be deemed prior art to the present invention, previous efforts have been made to stabilize oscillators to provide constant magnitude output pulses against variations in the ambient temperature which vary the impedance and gain of the semi-conductor elements. Some of these oscillators employ bias circuits which shift the operating point of the amplifying element to compensate for temperature variations. For example, U.S. Pat. No. 2,849,611 discloses a regenerative oscillator employing a transducer which varies a DC output of the amplifier as a function of changes in impedance of the transducer. A bias network employing negative temperature coefficient elements compensates for shifts in the operating point produced by the effects of temperature on the semi-conductor amplifier. The shift in bias point produced by circuits of this type is quite small and they operate to maintain the frequency of the oscillator constant independent of the temperature variations.

SUMMARY OF THE INVENTION

The present invention is broadly directed toward an oscillator for generating induction heating currents employing a bias network controlled by the regenerative feed-back which shifts the operating point of a transistor to adjust the conduction period to maintain stable oscillation independent of variations in the load impedance. The bias circuit and associated circuitry are also designed to allow the amplifier to start out as a class A amplifier and quickly shift into the more efficient class C operation. The same circuit provides automatic shut-down of the amplifier when an overload occurs to prevent damage to the circuitry.

The preferred embodiment of the invention takes the form of a Hartley oscillator arranged in a grounded emitter circuit. The entire tank inductance acts as the primary of the induction heating transformer and the tickler coil is preferably positioned in the same relation to the load as is the tank coil to experience impedance variations as a function of load impedance variations which follow those of the tank coil.

A bias circuit connected to the base of the transistor employs the parallel combination of a capacitor and a diode. The capacitor is charged by the tickler feed-back current and is discharged by the base-emitter current of the transistor. As the load on the output coil increases its inductance decreases, decreasing the Q of the tank circuit. Therefore the impedance of the tank circuit decreases and the emitter-collector voltage across the transistor increases, increasing the base-emitter current. This drains charge from the bias capacitor allowing the base bias point to shift to allow conduction for a greater interval to provide the current necessary to sustain oscillation.

In the start-up mode there is no charge on the bias capacitor and the circuit is conductive for a full 180°. After a few oscillations have occurred, charging the bias capacitor, the operating points shift to class C operation. During this period diodes connected between the base and collector prevent the transistor from saturating. The circuit also provides automatic shut-down in the event of excess load since the higher load decreases the tank circuit currents to the point where they no longer provide sufficient feed-back through the tickler coil to maintain oscillations.

The present invention therefore provides an induction heating oscillator which shifts its operating point and frequency in response to variation load impedances in an automatic manner to maintain optimal efficiency. The circuit is simple and low in cost and provides for an efficient manner of start-up and automatic shut-down.

Other objectives, advantages and applications of the present invention will be made apparent by the following detailed descriptions of a preferred embodiment of the invention. The description makes reference to the accompanying drawings in which.

Figure 1:
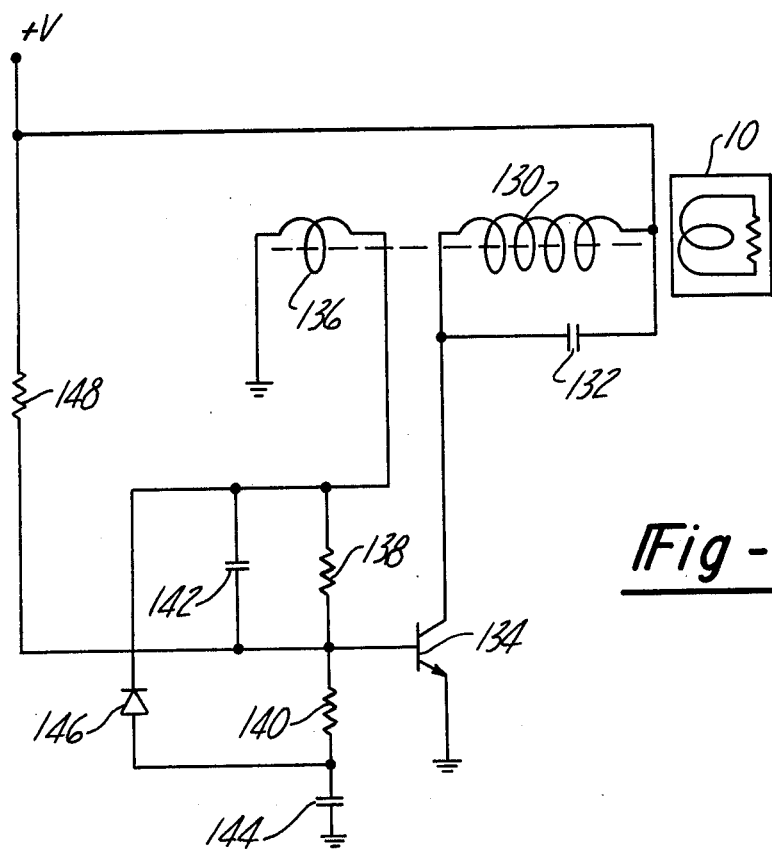
FIG. 1 is a schematic diagram of a first embodiment of the invention.

Referring to FIG. 1, a conductive workpiece in which heating currents are to be induced by the apparatus is schematically illustrated as a square plate 10. The plate 10 is disposed in relatively intimate positional relationship with a tank coil 130 of the induction heating generator, generally indicated at 12. The inductance 130 is shunted by a capacitor 132 and collectively the two form the tank circuit of the oscillator.

The tank circuit is disposed in the collector path of an NPN transistor 134 which has its emitter grounded. The other end of the tank circuit is connected to the positive terminal of an appropriate direct current power supply. Accordingly, the currents which flow through the tank circuit are limited by the emitter-collector resistance of the transistor 134.

Regenerative feed-back for the oscillator is produced by a small tickler coil 136 disposed in physical proximity to both the heating coil 130 and the load 10. One end of the tickler coil is grounded and the other end is connected to the base of the transistor 134 through a resistor 138. The base is also connected to ground through a resistor 140 and a capacitor 144.

A base biasing circuit consists of a capacitor 142 and a diode 146 shunted across the series combination of the capacitor 142 and the resistor 140. The base is also biased through a resistor 148 connected between the base and the positive terminal of the power supply.

During start-up the bias for the transistor is provided by the resistor 148 causing the transistor to start in class A and to be conductive for a full 180° of oscillation at a frequency determined by the impedance of the tank circuit. After just a few cycles of operation the current induced in the tickler coil by current flow through the tank circuit begins to charge the capacitor 142 with a voltage that is rectified by the diode 146. The charge on the capacitor shifts the bias point on the transistor 134 beyond cut-off so that the transistor starts conducting for less than 180° out of every cycle. The shift continues until the oscillator is operating fully in class C.

The current flowing through the inductor 130 will build up an electromagnetic field which induces complementary currents in the load 10. Depending upon the degree of coupling between the inductance 130 and the load 10, and the reactance of the load, the inductance of the coil 130 will be reduced, shifting the resonant frequency of the tank circuit to increase the frequency of oscillation. This loading also decreases the Q of the tank circuit and decreases its stored energy so that more external current is required to sustain oscillation. The decrease in circulating current causes a reduction in current flow to the bias capacitor 142 changing the bias on the transistor 134 so that conduction of the transistor occurs for a greater portion of each cycle. This provides the additional current required to maintain the oscillations at the new frequency controlled by the loading. As the load is decreased the frequency of oscillation decreases and the bias circuit shifts cut-off so that conduction is required for a lesser part of each cycle.

This circuit also provides automatic shut-down at excessive loads. This occurs when the circulating currents in the tank coil decrease to the point where they no longer provide sufficient feed-back through the tickler coil to maintain oscillation. Under these conditions the resistor 148 limits the base current to a very low value, thereby limiting collector current to a safe value.

To the extent that the impedance of the tickler coil is modified by reflected impedance from the load, the regulatory action of the circuit is enhanced because the bias point is shifted more quickly as a result of changes in the load impedance.

Figure 2:
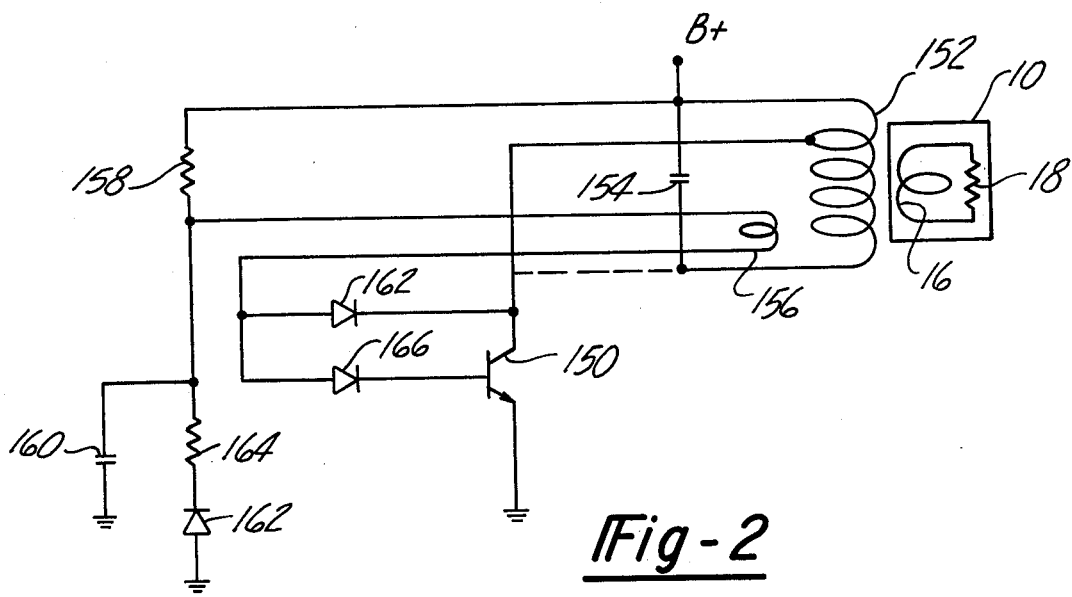
FIG. 2 is a schematic diagram of an alternative embodiment of the invention employing certain additional features.

An alternative form of a circuit is illustrated in FIG. 2. The circuit also employs an NPN transistor 150 having its emitter grounded and its collector connected to a tap on a tank inductance 152. The tap is near the end of the inductance connected to the positive terminal of a power supply. The entire inductance 152 acts as an induction heating coil for a load 10 which is schematically illustrated as consisting of a single turn 16 connected in series with a resistor 18 representing the impedance of the load.

The entire inductor 152 is shunted by a capacitor 154. The significance of the connection of the transistor collector to the tap is that the entire power supply voltage, less the drop across the transistor emitter-collector circuit, appears across the small portion of its coil between the tap and the power supply and a substantially higher voltage is induced into the balance of the coil. This creates a substantially higher voltage in the load than would otherwise occur and is useful with high impedance loads.

Regenerative feed-back for the oscillator is provided by a tickler coil 156 connected in series with a current limiting resistor 158 between the positive terminal of the power supply and the base of the transistor, a bias circuit consisting of a capacitor 160 and a shunting diode 162, in series with a resistor 164 is connected to the junction of the resistor 158 and the tickler coil 156 and biases the base through the lower impedance tickler coil in the same manner as the bias circuit of FIG. 1.

The bias circuit is connected to the base of transistor 150 through a diode 166 and is also connected to the collector through a diode 168. The diodes 166 and 168 prevent the base voltage of the transistor from equalling the collector voltage during periods of high base current. If this occurred the transistor would saturate, increasing its storage time and possible its switching time. The two diodes 166 and 168, in connection with the rectifying junction in the transistor base-emitter circuit allow the base voltage to approach to within one junction drop of the value of the collector.

The resistor 158 biases the base to a value which allows class A operation during starting and the feed-back currents produced by the tickler coil quickly charge the capacitor 160 with voltage rectified by the diode 162 to shift the bias point to allow class A operation.

Both circuits are simple in construction, automatically shift the base bias to maintain stability in view of a varying load, and provide automatic shut-off at excessive currents.

The embodiments of the invention in which an exclusive property or privilege is claimed are defined as follows:

1. A generator for applying an oscillatory electromagnetic field to an electrically conductive load to induce currents in said load, comprising: a transistor; a tank circuit connected in the emitter-collector circuit of the transistor, the tank circuit including a capacitor and an inductor adapted to be disposed in operating relationship to said load; a bias circuit consisting of a capacitor and a rectifier connected in the base circuit of the transistor; and a tickler coil supported to experience the electromagnetic field generated by the inductor and connected to the bias circuit, whereby the generator begins oscillation as a class A oscillator and achieves class C oscillation after start-up, and the charge on the bias circuit varies as an inverse function of the tank circuit impedance to maintain a constant average tank circuit current independent of variations in the tank circuit impedance.

2. The generator of claim 1 including a direct current power supply connected to the emitter-collector circuit of the transistor.

3. The generator of claim 1, including a current limiting resistor connected in series between the base circuit of the transistor and the power source.

4. The generator of claim 3 in which the value of the resistance is such as to provide an initial bias to the base of the transistor to cause the transistor to be conductive through 180° out of every oscillation cycle.

5. The generator of claim 1 in which the load constitutes a conductive element to be induction heated by current induced into the load from the inductor.

6. An induction heating generator for generating an oscillating electromagnetic field to induce electric currents in a conductive load comprising: a transistor; a power supply; a tank circuit consisting of the parallel combination of a capacitor and an inductor coil, with the inductor coil being disposed in such spacial relationship to said load as to induce electromagnetic currents in the load when the generator is operative, the tank coil being disposed in series with the emitter-collector circuit of the transistor across the power supply; a bias circuit consisting of the parallel combination of a capacitor and a diode connected between the base of the transistor and a first terminal of the power supply; a tickler coil supported in physical proximity to the inductor coil and connected to the base circuit of the transistor to apply a voltage to the base with is a direct function of the current flowing through the inductor; and a connection between the second terminal of the power supply and the base, said last connection including means for limiting the current flowing from the power supply to the base, whereby said last connection provides the initial bias for the transistor causing it to start as a class A amplifier and a voltage applied to the bias circuit through the tickler coil will cause the amplifier to shift to class C operation with the period of conduction varying as an inverse function of the impedance of the tank coil to maintain a substantially constant current through the tank circuit.

7. The oscillator of claim 6 including a diode connected between the base and one of the other terminals of the transistor to prevent the transistor from saturating.

* * * * *